(12) United States Patent
Ebermann

(10) Patent No.: US 6,955,055 B2
(45) Date of Patent: Oct. 18, 2005

(54) HOUSING FOR ACCOMMODATING AT LEAST ONE ENERGY ACCUMULATOR DEVICE

(75) Inventor: Heiko Ebermann, Dresden (DE)

(73) Assignee: Knuerr AG, Arnstorf (DE)

( * ) Notice: Subject to any disclaimer, the term of this patent is extended or adjusted under 35 U.S.C. 154(b) by 23 days.

(21) Appl. No.: 10/471,744

(22) PCT Filed: Feb. 15, 2002

(86) PCT No.: PCT/EP02/01615

§ 371 (c)(1),
(2), (4) Date: Sep. 24, 2003

(87) PCT Pub. No.: WO02/078414

PCT Pub. Date: Oct. 3, 2002

(65) Prior Publication Data

US 2004/0086780 A1 May 6, 2004

(30) Foreign Application Priority Data

Mar. 27, 2001 (DE) .......... 101 14 960

(51) Int. Cl.[7] .............. F25B 21/02
(52) U.S. Cl. ............. 62/3.6; 62/3.3; 62/3.7; 62/452; 62/453; 62/455; 312/236
(58) Field of Search .......... 429/120, 62; 62/3.6, 62/440, 452–455; 312/236; 361/688, 696, 697, 707, 710

(56) References Cited

U.S. PATENT DOCUMENTS

| | | | |
|---|---|---|---|
| 4,314,008 A | 2/1982 | Blake | |
| 4,454,566 A | * 6/1984 | Coyne | ............ 361/721 |
| 4,891,949 A | 1/1990 | Caldarola | |
| 4,913,713 A | * 4/1990 | Bender et al. | ........ 62/3.61 |
| 4,949,218 A | 8/1990 | Blanchard et al. | |
| 5,315,830 A | 5/1994 | Doke et al. | |
| 5,437,939 A | 8/1995 | Beckley | |
| 5,501,076 A | 3/1996 | Sharp, III et al. | |
| 5,567,542 A | 10/1996 | Bae | |
| 5,603,220 A | * 2/1997 | Seaman | ............ 62/3.7 |
| 5,763,118 A | 6/1998 | Stafford et al. | |
| 5,806,948 A | 9/1998 | Rowan, Sr. et al. | |
| 5,832,988 A | 11/1998 | Mistry et al. | |
| 6,038,865 A | * 3/2000 | Watanabe et al. | ........ 62/3.6 |
| 6,123,266 A | * 9/2000 | Bainbridge et al. | ...... 236/49.3 |
| 6,294,721 B1 | 9/2001 | Oravetz | |

FOREIGN PATENT DOCUMENTS

DE 298 20 993 U1 1/1999
DE 200 07 920 U1 9/2000

* cited by examiner

*Primary Examiner*—Cheryl J. Tyler
*Assistant Examiner*—Richard L. Leung
(74) *Attorney, Agent, or Firm*—Jacobson Holman PLLC

(57) ABSTRACT

The invention relates to a casing for receiving at least one energy storage device, whereof the temperature in the casing interior can be regulated to a predetermined temperature level. For this purpose the casing interior is thermally insulated and is in direct heat conducting connection with a heat transfer device, substantially the entire heat flow into and out of the casing interior taking place through the heat transfer device when the casing interior is closed.

14 Claims, 1 Drawing Sheet

HOUSING FOR ACCOMMODATING AT LEAST ONE ENERGY ACCUMULATOR DEVICE

Figure 1:
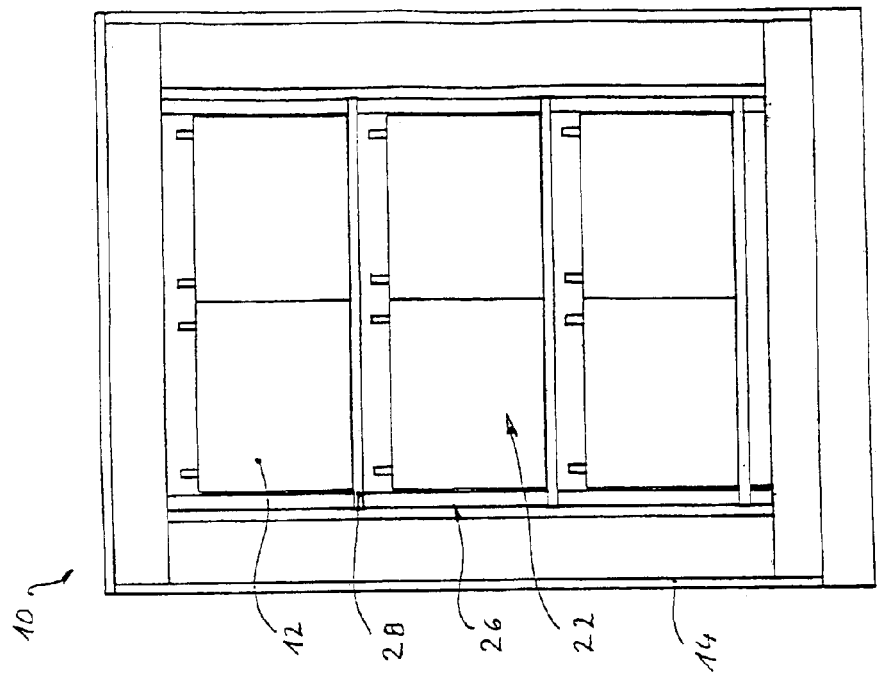

This is a nationalization of PCT/EP02/01615 filed Feb. 15, 2002 and published in German.

The invention relates to a casing for receiving at least one energy storage device according to the preamble of claim 1.

A casing of the aforementioned type is known and more particularly serves as a battery cabinet for receiving batteries and/or rechargeable accumulators as energy storage devices. Such energy storage devices or electric power storage devices, particularly high-performance batteries and accumulators, are characterized in that they must be operated within a predetermined operating temperature range, so that they have a maximum service life and a maximum storage capacity. In the case of such energy storage devices, a continuous temperature rise compared with the said predetermined operating temperature range leads to a clear reduction in the life of the energy storage device, whilst an operation of the energy storage device at below said predetermined operating temperature range leads to a marked reduction in the storage capacity of the energy storage device.

More particularly if the casing for receiving the energy storage device is installed outdoors, it is the problem that the temperature in the casing interior oscillates in dependence on the ambient temperature, so that the energy storage device cannot be operated in the optimum operating temperature range. To avoid this, it is known to regulate the temperature in the casing interior to a predetermined temperature range using a heat transfer device.

Thus, DE 200 07 920 U1 discloses a ventilating device for a casing containing electrical and electronic components. With the aid of the ventilating device an internal air flow is sucked out of the casing interior, cooled or heated by an external air flow sucked from the environment and following temperature matching is returned to the casing interior. In addition, within the ventilating device is provided a heat transfer device positioned in such a way that with it heat can, as desired, be transferred actively from the internal to the external air flow or from the external to the internal air flow. The problem arises with this known ventilating device that air has a comparatively low thermal capacity, so that more particularly in the case of a sudden temperature change in the casing interior, despite the use of the heat transfer device, the temperature in the casing interior can only be slowly returned to the predetermined temperature range.

DE 298 20 993 U1 discloses a device for exchanging thermal energy between the interior of a casing and the casing environment. This known device has a heat exchange block with two separate fluid conduction systems which are in thermal energy-transferring contact, the first fluid conduction system being connected to the casing interior and the second fluid conduction system to the environment. As the two fluid conduction systems must be constructed separately from one another, said known device has a comparatively complicated construction. Moreover, here again the thermal capacity of the fluid in the fluid conduction system is low, so that also with this known device the temperature in the casing interior, in the case of a sudden temperature change, can only be adjusted relatively slowly again to the predetermined temperature range.

U.S. Pat. No. 6,123,266 A describes a cooling system for outdoor battery cabinets. An air flow through the cabinet interior having superimposed battery rows is brought about by an air intake in the upper area of a casing wall and an air exhaust in a lower area of said casing wall with the aid of at least one fan. The battery rows are placed on offset shelves provided with air passage openings and the entire battery cabinet is provided with an inside insulation. With the aid of a controller the fan is switched on for producing an air flow, as soon as the outside temperature is lower than the temperature in the cabinet interior. In the case of a higher outside temperature, the fan is not put into operation in order to maintain the lower cabinet internal temperature. The known ventilating system is unsuitable for relatively large temperature fluctuations.

A temperature stabilized battery system is known from U.S. Pat. No. 4,314,008. A battery unit is surrounded by a heat conducting material, particularly aluminum foil, and is located in an envelope of heat insulating material, e.g. polyurethane foam. One longitudinal side of the battery unit is connected by means of a heat conducting block to a heat pump constituted by Peltier elements and with a heat sink in order to maintain the temperature range necessary for smooth battery operation. The heat sink is much larger than the battery unit and has external ribs. The temperature stabilization provided by U.S. Pat. No. 4,314,008 is only suitable for relatively small casings and also has a relatively complicated construction and installation.

The object of the invention is to provide a casing for receiving at least one energy storage device, where the casing interior can be kept without great effort and expenditure within a predetermined temperature range, even in the case of major temperature fluctuations outside the casing.

The invention achieves the object through a casing having the features of claim 1.

According to the invention a casing for receiving at least one energy storage device, particularly a battery cabinet, with at least one heat transfer device for regulating the temperature of a casing interior to a predetermined temperature level, in which the casing interior is thermally insulated, the heat transfer device being in direct heat conducting connection with the casing interior and where with the casing interior closed virtually the entire heat flow into and out of the casing interior takes place through the heat transfer device and where in an area of a casing wall a heat exchanger is provided, which is connected in heat conducting manner to the heat transfer device, is provided with a spine fin recuperator, which is located in a flow channel of the heat exchanger for a cooling medium, particularly air. According to the invention at least one delivery device is provided for the flow channel cooling medium.

In order to emit to the casing environment as rapidly as possible the heat absorbed by the heat transfer device on heating the casing interior, the heat transfer device is connected in heat conducting manner with the heat exchanger e.g. provided on the casing outside and a heat exchanger has at least one flow channel through which it is possible to deliver a cooling medium for cooling the heat transfer device. A suitable cooling medium is e.g. a gas, preferably air, which is delivered through the flow channel. Alternatively the heat transfer device can be cooled by a liquid with a high, specific thermal capacity such as e.g. water.

Advantageously the heat exchanger has a spine fin recuperator connected in heat conducting manner to the heat transfer device and which as a result of its spine rib structure has a very large outer surface area with which the heat absorbed by the spine fin recuperator can be rapidly emitted to the environment by convection. The spine fin recuperator is preferably integrated into the casing wall, e.g. the rear wall, which gives a particularly compact construction compared with a spine fin recuperator separate from the casing.

As the heat exchanger has at least one delivery device for delivering the cooling medium through the flow channel, e.g. as a function of the heat quantity to be dissipated by the heat exchanger, the quantity of cooling medium to be delivered through the flow channel can be regulated in a planned manner. If air is used as the cooling medium, in particular the use of one or more axial flow fans is proposed, because, based on their size, such axial flow fans have a particularly high delivery capacity when compared with other fans. The number of axial flow fans is particularly dependent on the heat quantity to be dissipated and the ambient conditions.

It is advantageous that the delivery device can be switched off if the heat transfer device is heating the casing interior, which gives a particularly high heating capacity of the heat transfer device, without a part of the heat quantity emitted by the heat transfer device being undesirably dissipated by the cooling medium delivered through the delivery device.

As a result of the thermally insulated casing interior, there are no undesired heat bridges and a heat transfer between the casing interior and the casing environment at the most occurs with an extremely long time lag. Othersides, according to the invention it is possible to have a planned, rapid heat transfer into and out of the casing interior, in that the sole, permitted heat bridge between the thermally insulated casing interior and the casing environment is the heat transfer device and a heat exchanger device connected in heat conducting manner with a spine fin recuperator in a flow channel for a cooling medium and located on a casing wall, so that virtually the entire heat flow into and out of the casing interior can be transferred rapidly, effectively and in a controlled manner.

So that any necessary heat transfer takes place as rapidly as possible, it is appropriate to directly and in heat conducting manner connect the heat transfer device to the casing interior, i.e. the materials of the casing forming the casing interior are in direct heat conducting connection with the heat transfer device. With the aid of the materials in the casing interior which are connected in heat conducting manner with the heat transfer device, it is possible heat in the case of a desired heat transfer to rapidly dissipate and supply to and from the casing interior.

Further advantageous developments of the invention can be gathered from the following description, subclaims and drawing.

It is advantageous that in the casing according to the invention heat bridges between the casing interior and the casing environment are avoided and that the casing interior is thermally decoupled from the casing environment.

In a particularly preferred embodiment of the casing, it is proposed that the heat transfer device be located in the casing insulation, so that at the most the heat transfer device is exposed to small temperature fluctuations so that a particularly precise temperature regulation of the casing interior to the predetermined temperature level is possible.

It is particularly advantageous if the heat transfer device is connected in heat conducting manner to a frame located in the casing interior and on which is to be placed the energy storage device. Through the use of the frame connected in thermally conducting manner to the heat transfer device, it is possible, with the aid of the frame to rapidly and directly dissipate to the heat transfer device the heat arising in the energy storage device particularly during the charging thereof and which in turn tun rapidly emits the absorbed heat to the casing environment. As a result of the rapid heat removal, the heating energy storage device at the very most emits small heat quantities by convection to the casing interior, so that at the most the latter is only slightly heated during a charging of the energy storage device.

It is also proposed that the heat transfer device be connected in heat conducting manner to the casing interior with the aid of a heat transmitting element, so that the heat transfer device can be spaced from the casing interior.

If the heat transfer device is located in the casing insulation, the heat transfer device can be connected in heat conducting manner by a further heat transmitting element to the heat exchanger for heat transmission purposes.

The heat transmitting elements, with which the heat transfer device is connected to the casing interior and to the heat exchanger, in a particularly preferred embodiment of the invention have a comparatively high thermal conductivity $\lambda$. A suitable material for the same is e.g. aluminum with a thermal conductivity of 220 W/mK, magnesium with a thermal conductivity of 171 W/mK, copper with a thermal conductivity of 384 W/mK or alloys of metals with similar high thermal conductivities.

If the casing is used for an energy storage device with a comparatively high storage capacity, in a preferred embodiment of the casing it is proposed that the casing has several planes for receiving the energy storage device. To ensure a correspondingly rapid heat transfer between the casing interior and the casing environment, it is also proposed in this embodiment that with each plane is associated at least one heat transfer device, so that e.g. in the case of a differing heating of each plane in the casing interior, the resulting heat quantity can be dissipated or supplied in a selective manner by the particular heat transfer device relative to the given plane. It is alternatively possible to thermally couple the different planes by a common heat transmission element to one or more heat transfer devices.

Preferably the heat transfer device is constituted by a Peltier element with which, as a function of the flow direction applied, rapidly and without difficulty a heat flow can be dissipated from or supplied to the casing interior. In this connection a Peltier element is understood to mean an arrangement formed from one or more Peltier units.

The invention is described in greater detail hereinafter relative to an embodiment and the drawings, wherein show:

FIG. 1 A side view of a casing according to the invention, in which the side covering has been omitted.

Figure 2:
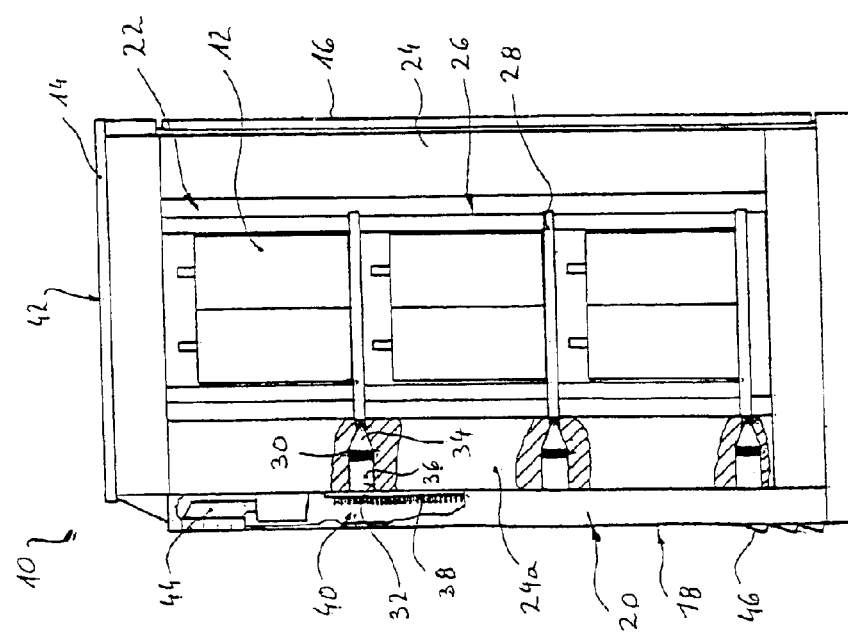

FIG. 2 A front view of the casing of FIG. 1, in which the front of the casing is shown open.

FIGS. 1 and 2 show a casing 10 constructed as a battery cabinet in which are arranged on a total of three reception planes 28 twelve accumulators or batteries 12. The batteries 12 are connected to not shown lines leading out of the casing 10. The casing 10 shown in FIGS. 1 and 2 is more particularly installed outside and is used there e.g. for a temporary or permanent voltage supply for e.g. telecommunications devices, transmission masts and the like.

The front of the casing 10 with side walls 14 and a rear wall 18 is closed by a swing door 16 (cf. FIG. 1), which is not shown for representational reasons in FIG. 2. In the vicinity of the rear wall 18 of casing 10 is provided a heat exchanger 20, whose structure will be explained hereinafter. For representation reasons FIG. 1 omits the left-hand side covering of FIG. 2.

The interior 22 of the casing 10 is thermally insulated by an insulation 24, e.g. insulating inserts 24, with respect to the environment of the casing 10, the insulating inserts 24 fixed to the side walls 14, rear wall 18, door 16, top 42 and bottom 43 being dimensioned in such a way that at the very most there is an extremely small heat transfer between the interior 22 and the environment of casing 10.

In the interior 22 of casing 10 is provided a frame 26, which has as reception planes 28 a total of three superimposed shelves 28, each of which is used for four accumulators or batteries 12. The frame 26 and shelves 28 are preferably made from a very highly conductive material, such as e.g. a steel alloy. In order to ensure a particularly good heat transmission between the batteries 12 and shelves 28, said batteries 12 can be connected in heat conducting manner to the shelves 28, e.g. by heat conducting foils.

Between the rear wall 18 of casing 10 and the frame 26 located in interior 22 there are in all three Peltier elements 30 as heat transfer devices 30. Each Peltier element 30 is inserted in a corresponding reception opening 32 in the rear insulating insert 24a. The reception openings 32 are so positioned in the rear insulating insert 24a that each reception opening 32 is oriented both vertically and horizontally centrally with respect to in each case one of the shelves 28 of frame 26.

In the reception opening 32 between each shelf 28 and the Peltier element 30 associated with it is provided a heat transmitting element 34, which connects the particular Peltier element 30 in heat conducting manner to the shelf 28. Between the heat exchanger 20 integrated into the rear 18 and the particular Peltier element 30, a further heat transmitting element 36 is inserted in the reception opening 32, which connects the Peltier element 30 in heat conducting manner to the heat exchanger 20. The heat transmitting elements 34 and 36 are made from a particularly good heat conducting material. The material for the heat transmitting elements 34 and 36 can be e.g. copper, aluminum, magnesium or an alloy of one of these metallic materials.

The heat exchanger 20 provided on the back 18 has a spine fin recuperator 38, which is placed in a flow channel 40 of heat exchanger 20 constructed on the back 18. At the upper end of the flow channel 40 and close to the top 42 of casing 10 there are two delivery devices 44, for instance axial flow fans 44 in the flow channel 40, but only one of these can be seen in FIG. 1 for representational reasons. During operation, the axial flow fans 44 suck air from the outside into the flow channel 40 and said air is delivered along the spine fin recuperator 38 through flow channel 40 and passes out of outlet ports 46 at the lower end of the flow channel 40.

The operation of the casing 10 will now be described in greater detail. The accumulators or batteries 12 located in casing 10 are e.g. high-performance accumulators or batteries, which must be operated in a predetermined temperature range of 15 to 25° C. If the operating temperature of the batteries 12 is constantly 10° C. over the maximum permitted operating temperature of 25° C., there is a halving of the service life of the batteries 12, whilst operating temperatures above 45° C. lead to a failure of the batteries 12. If the operating temperatures of the batteries 12 are below the predetermined, minimum permitted temperature of 15° C., there is a reduction to the charging capacity of the batteries 12, so that additional batteries 12 must be kept in stock. In order to be able to operate the batteries 12 in casing 10 within the permitted temperature range of 15 to 25° C., the temperature in the interior 22 of casing 10 can be regulated with the aid of the Peltier elements 30, as will be explained hereinafter.

If the temperature in the environment of the casing 10 drops to such an extent that the temperature in the interior 22 falls below the minimum permitted temperature value of 15° C., the dropping below the minimum permitted temperature value is detected by a not shown control, which measures the temperature in the, interior 22. In this case the control activates the Peltier elements 30 connected thereto, whilst simultaneously deactivating the axial flow fans 44, provided that they are still in operation. The Peltier elements 30 are switched in such a way that they heat and the resulting heat quantity is largely emitted by the heat transmitting elements 34 to the shelves 28. As the shelves 28 are connected in heat conducting manner to the batteries 12, the latter are heated and at the same time the frame 26 heats the interior 22 to the desired interior temperature. It is possible in this way to compensate the heat loss of the interior 22 of casing 10 caused by the low ambient temperature and the batteries 12 are consequently operated within the predetermined temperature range.

If the temperature in the interior 22 of casing 10, e.g. during the charging of the batteries 12 or as a result of comparatively high temperatures in the environment of casing 10 rises to such an extent that it is above the maximum permitted temperature value of 25° C., the control switches the Peltier elements 30 in such a way that they cool the shelves 28 connected therewith in heat conducting manner and the absorbed heat is emitted by the further heat transmitting elements 36 to the spine fin recuperator 38 of heat exchanger 20. If the cooling capacity of the spine fin recuperator 38 is not sufficient, then additionally the axial flow fans 44 are switched on and which suck the cooling air into the flow channel 40 for cooling the spine fin recuperator 38.

As soon as the temperature in the interior 22 of casing 10 has again dropped to the desired temperature value, the control deactivates the Peltier elements 30 and axial flow fans 44.

Through the use of the Peltier elements 30, in connection with a heat exchanger 20 having at least a flow channel 40, the interior 22 of the inventive casing 10 can be very rapidly cooled or heated, so that a malfunction of the batteries 12 caused by an excessively high or low operating temperature can be prevented in a simple way. In the described embodiment use is made of a heat exchanger 20, whose spine fin recuperator 38 is cooled by air. It is also conceivable to use as the cooling medium water or some other liquid, which has a correspondingly high cooling capacity. It is also possible to separate the interior 22 through the shelves 28 in such a way that at the most there is a slight heat exchange between the individual chambers formed by the shelves 28 and each Peltier element 30 can separately heat or cool each individual chamber of the interior 22.

For several Peltier elements 30 it is possible in each case to thermally couple at least one common heat transmitting element 34 to the shelves 28, in order to heat or cool to the desired temperature the frame 26 with the shelves 28.

What is claimed is:

1. A cabinet for receiving energy storage devices (12), comprising:

a casing (10) having side walls (14), a rear wall (18), a door (16), a top (42), and a bottom (43), all of the side walls (14), rear wall (18), door (16), top (42), and bottom (43) having an inside, a thermally insulated casing interior (22), the casing interior (22) including insulating inserts (24) on the inside of the side walls (14), rear wall (18), door (16), top (42), and bottom (43), and having a closed condition, a plurality of heat transfer means (30) for regulating the temperature of the casing interior (22) to a predetermined temperature level, the heat transfer means (30) being in direct heat conducting connection with the casing interior (22), the entire heat flow into and out of the casing interior (22) taking place through the heat transfer means when the casing interior (22) is in the closed condition, a heat exchanger (20) in the area of the rear wall (18), the heat exchanger (20) having a flow channel (40) and at least one delivery means (44) for delivery of a cooling medium through the flow channel (40), the heat transfer means (30) being connected in conducting manner to the heat exchanger (20), wherein:

the heat exchanger (20) has a spine fin recuperator (38) having a spine fin structure, the spine fin structure being integrated into the rear wall (18) of the casing (10);

the casing interior (22) is provided with a frame (26) having superimposed shelves (28) for receiving the energy storage devices (12), each shelf (28) being connected in heat conducting manner with one of the heat transfer means (30), and the insulating insert (24) on the inside of the rear wall (18) is provided with reception openings (32) for receiving a heat transfer means (30), whereby each reception opening (32) is oriented both vertically and horizontally centrally with respect to one of the shelves (28) of the frame (26).

2. The cabinet according to claim 1, wherein the heat transfer means are constructed as Peltier elements (30).

3. The cabinet according to claim 1, wherein the at least one delivery means is an axial flow fan (44).

4. The cabinet according to claim 1, wherein the delivery means (44) is switched off if the heat transfer means (30) heats the casing interior (22).

5. The cabinet according to claim 1, wherein each heat transfer means (30) is connected in heat conducting manner to the corresponding shelf (28) of the frame (26) in the casing interior (22) with the aid of a heat transmitting element (34).

6. The cabinet according to claim 5, wherein each transmitting element (34) is arranged in the reception opening (38) of the insulating insert (24) and is positioned between the corresponding shelf (28) and the heat transfer means (30).

7. The cabinet according to claim 5, wherein the heat transmitting element (34) is made from a material having a high thermal conductivity A.

8. The cabinet according to claim 1, wherein the heat transfer means (30) is connected in heat conducting manner to the heat exchanger (20) by a further heat transmitting element (36).

9. The cabinet according to claim 8, wherein each further transmitting element (36) is arranged in the reception opening (38) of the insulating insert (24) and is positioned between the heat exchanger (20) and the corresponding heat transfer means (30).

10. The cabinet according to claim 8, wherein the further heat transmitting element (36) is made from a material having a high thermal conductivity.

11. The cabinet according to claim 1, wherein at least two of the shelves (28) are connected in heat conducting manner by at least one heat transmitting element (34) and the heat transmitting element (34) is thermally coupled to one of the heat transfer means (30).

12. The cabinet according to claim 1, wherein the energy storage device (12) has at least one accumulator and at least one battery.

13. The cabinet according to claim 1, wherein the energy storage device (12) has at least one accumulator.

14. The cabinet according to claim 1, wherein the energy storage device (12) has at least one battery.

* * * * *